Sept. 16, 1952 E. J. SASS ET AL 2,611,010

PRINTED CIRCUIT STRUCTURE FOR HIGH-FREQUENCY APPARATUS

Filed July 30, 1949 2 SHEETS—SHEET 1

INVENTORS
Earl J. Sass &
Donald Mackey
BY H. W. Muston
ATTORNEY

PRINTED CIRCUIT STRUCTURE FOR HIGH-FREQUENCY APPARATUS

Filed July 30, 1949 2 SHEETS--SHEET 2

INVENTORS
Earl J. Sass &
Donald Mackey
BY H. W. Newton
ATTORNEY

Patented Sept. 16, 1952

2,611,010

UNITED STATES PATENT OFFICE 2,611,010

PRINTED CIRCUIT STRUCTURE FOR HIGH-FREQUENCY APPARATUS

Earl J. Sass, Oaklyn, and Donald Mackey, Haddon Heights, N. J., assignors to Radio Corporation of America, a corporation of Delaware Application July 30, 1949, Serial No. 107,784

3 Claims. (Cl. 175—298)

This invention relates to printed circuit structures for high frequency apparatus, such as radio and television receivers and the signal input circuits thereof.

In the present search for less costly means with which to provide high frequency electric circuits such as those used in radio and television receivers, "printed circuit" developments have assumed a dominant position. A summary of these developments is contained in the National Bureau of Standards Circular 468, entitled "Printed Circuit Techniques." Briefly these techniques are exemplified by the application of suitably shaped conductive circuit portions, including inductance and capacitance elements, as a coating or stratum on a non-conductive carrier surface through a stencil for example, or by means of a printing plate, so that by merely supplying successive carriers and repeating the application step, individual circuits can be readily produced in large quantities with very little manual operation.

In the past however, the effectiveness of printed circuit methods has been considerably limited by difficulties experienced with certain circuit elements as above mentioned, coupling transformer elements, transmission lines and the like, and by circuit complications such as crossover connections. As an example of prior art difficulties, capacitors for example, are provided as individual elements and applied to the partly prepared printed circuits and the connections are completed by separate leads. Crossover connections have introduced undesired electrical linkage between insulated leads that cross in closely adjacent relationship even though additional dielectric is interposed between them.

It is an object of the present invention to provide improved circuit structures for high frequency apparatus, and circuit-preparing methods which obviate the above and other inherent disadvantages in prior art structures and methods.

A further object of the invention is the provision of improved circuits and systems for receiving, conveying and filtering high frequency signals, and circuit-preparing methods whereby capacitors as well as inductors and conductors are all readily incorporated in a unitary structure for that purpose.

Another object of the invention is the provision of improved and simplified printed type circuits and systems as above, including circuit elements such as transformers, transmission lines, and crossover connections and at relatively low cost of production.

The above as well as still further objects of the invention will be more readily understood from the following description of an exemplification thereof, reference being had to the accompanying drawings wherein.

Figure 1:
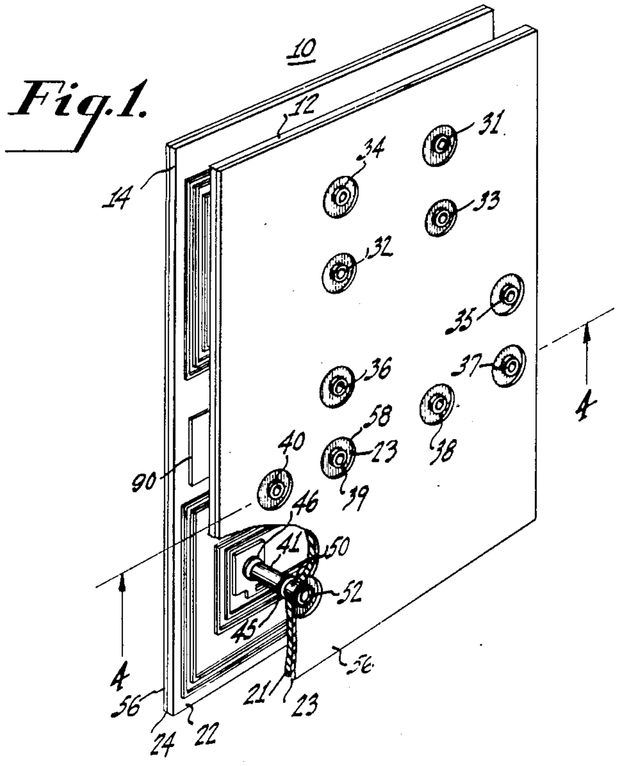
Figure 1 is a perspective view, with parts broken away, of a printed circuit structure embodying the invention.

According to the present invention a high frequency circuit or stem is provided substantially wholly as electrically conductive coating portions on sheets or plates of insulating material or other suitable means providing carrier surfaces, and capacitors are provided by merely securing to a surface portion of the plate or carrier, dielectric sheets each coated with one or more capacitor electrodes to provide desired capacitances. The individual capacitor electrodes are so disposed that the securing elements automatically may provide all the capacitor connections. Transformers and transmission lines are provided as pairs of side-by-side elongated conductive stratum portions extending in generally spiral shape. Crossover connections are dispensed with by subdividing the circuit into individual sections each free of internal crossover connections and uniting such sections in spaced relation so as to reduce the undesired effects of the interposition of a carrier with its relatively high dielectric constant between two independent parts of a circuit.

Figures 1 to 4 inclusive show a combination high frequency signal coupling and filter system embodying features of the invention. The system is shown in its entirety in Figure 1 as the assembly 10, of two dielectric carriers 12, 14, secured together in spaced relation by a plurality of tubular rivets or eyelets 31, 32, 33, 34, 35, 36, 37, 38, 39, 40 and 41. The spacing is provided by ridges or flanges 45, 46 on the individual eyelets. Each carrier sheet 12, 14 is perforated for receiving the eyelet shanks 50 between the flanges 45, 46 and the eyelet ends, and the ends are staked or riveted over after the system is assembled as shown, to provide enlarged anchoring heads 52.

On the external faces 23, 24 of the respective sheets 12, 14, there is held an electrically conductive film or stratum 56 in which gaps 58 are provided where it is desired to insulate them from the individual eyelets which may be metallic. The inner faces 21, 22 of the carriers 12, 14 are shown more fully in Figures 2 and 3 respectively.

On face 21, the sheet 12 carries four generally spiral inductors 61, 62, 63 and 64. The number of spiral turns is adjusted to provide the desired characteristics for each inductor, and is determined by the thickness of the conductive stratum as well as the other dimensions of the turns. In the interest of clarity, only the outer and inner turns of each spiral are illustrated, the intervening turns being represented by the dash-dot lines interconnecting these outer and inner turns. Inductor 61 extends from an end 71 to an end 72. Inductor 62 has turns side-by-side with and generally paralleling the turns of inductor 61, and extends from an end 73 to an end 74. The combination of inductors 61 and 62 can accordingly be considered a bifilar transformer. At the same time the dimensions of the individual turns, as well as the spacing between the turns of the different conductors, is adjusted to impart to each unit length of parallel conductors, the inductance and capacitance of a transmission line having a characteristic impedance suitable for carrying the desired signals and matching the impedance of the circuits between which it is connected.

Thus, the bifilar inductors are arranged to have an over-all inductance presenting, to signals of the lowest desired frequencies, a series signal impedance of about four or more times the characteristic transmission line impedance. Similarly, these inductors have an overall capacitance presenting, to signals of the highest desired frequencies, a signal shunting impedance of about four or more times the characteristic transmission line impedance. By way of example and not by way of limitation, the following bifilar transformer characteristics are highly suited for passing signals extending over the entire television spectrum from below 60 to above 200 megacycles per second when supplied by a 150 ohm transmission line:

| | Inches |
|---|---|
| Thickness of conductive stratum | 0.0015 |
| Width of an individual conductor | 0.01 |
| Spacing between adjacent edges of the parallel conductors in the respective inductors | 0.0185 |

The above constants will provide a transmission line having a characteristic impedance of slightly over 150 ohms. However, when waxed as by dipping the circuit carrying sheet 12 into molten wax, withdrawing and cooling, the characteristic impedance falls to the desired value. About eight turns of a spiral having the above constants and covering an area of two square inches are suitable for each of the individual conductors forming the bifilar transformer.

Conductive ends 75 and 76 are provided for inductor 63, while inductor 64 extends from end 72 to end 77. A conductor 66 is provided on face 21, for connecting two additional conductive ends 78 and 79.

On the opposing face 22, the sheet 14 carries three inductors 67, 68 and 69. Inductor 67 is provided with ends 81, 82, and ends 83, 84 terminate inductor 68. The inner end of inductor 69 is shown at 85, its outer terminus 86 having a connected extension 70 leading to another end 7.

Applied over face 22 a dielectric sheet 90 is held. The sheet 90 which may be quite thin, has on its outer surface a pair of conductive coatings 91, 92, and on its inner surface another pair of conductive coatings 93, 94 shown in dash-dot lines in Figure 3. These coatings function as capacitor electrodes, which together with the dielectric sheet 90, provide the desired circuit capacitances.

Figure 4:
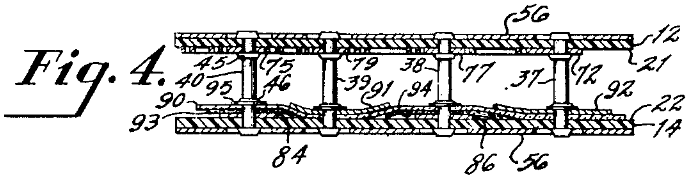
Figure 4 is a sectional view of the structure of Figure 1, taken along the line 4—4.
Figures 2, 3:
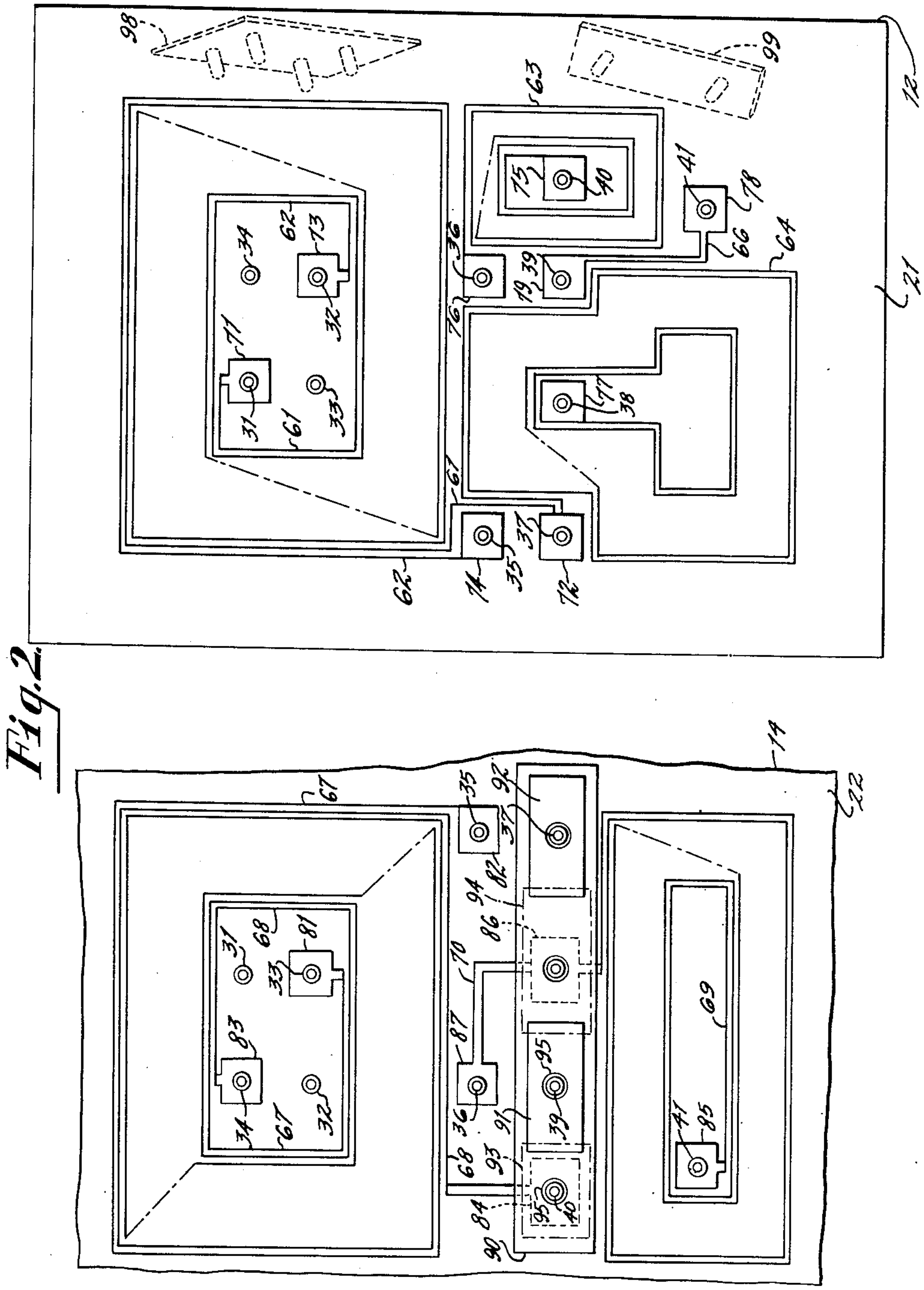
Figures 2 and 3 are enlarged plan views of the inner faces of two sections of the printed circuit structure of Figure 1 showing further details of the invention.

The necessary interconnections are shown as established by means of the conductive rivets 31, 32, 33, 34, 35, 36, 37, 38, 39, 40, and 41, all of which penetrate both sheets as shown in Figure 4. Rivets 31, 32, 33 and 34 may be hollow or in the form of eyelets so that they provide sockets for receiving pin or prong connections of a signal supply plug 98 as indicated in Figure 2. Rivet 35 interconnects conductive ends 74 and 82, and rivet 36 interconnects ends 76 and 87. Rivet 41 not only interconnects ends 78 and 85 but may be made hollow to provide a signal output socket for receiving a pin or prong of signal output plug 99.

Figure 4 shows the sheet 90 held in place, parts being distorted and omitted, and compliant bends, to accommodate varying thicknesses of intervening material, being exaggerated to more clearly illustrate the details.

Rivets 37, 38 39 and 40 function to hold the dielectric sheet 90 against the carrier 14, as well as to establish the connections to the suitable capacitive electrodes. Conductive ends 75 and 84 are connected together and to electrode 93 by means of rivet 40. Conductive end 79 is connected to electrode 91 through rivet 39. Ends 77 and 86 are jointly connected to electrode 94 with rivet 38, and rivet 37 connects end 72 to electrode 92. To protect the dielectric sheet 90 especially where it is quite thin and frangible, a sheet of mica for example, guards such as washers 95 may be interposed between the rivet flanges 46 and the sheet. The washers 95 may be arched and resilient so that the anchoring of the rivets deforms the washers by compressing them in place and tends to avoid the loosening of the contacts that may be caused by plastic flow of the carrier sheet 14 under prolonged compression. As shown, all the conductive circuit component ends are quite enlarged to assure suitable engagement with the corresponding rivet notwithstanding some misalignment of the rivet.

The electrodes 91, 92, 93, 94 are dimensioned to overlap on opposite surfaces of the dielectric to the extent required for the desired interelectrode capacitance. It will be noted that the four electrodes provide three capacitances, one between terminals 75 and 79, another between terminals 79 and 77 and a third between terminals 77 and 72. Adjustment of the capacitances, as for the purpose of compensating for variation in thickness of the dielectric sheet, is readily effected by removal of overlapping portions of the exterior electrodes 91 and/or 92. One suitable technique for removal of electrode material such as silver coatings is by striking a relatively low voltage electric arc between the portion to be removed and a small pointed cooperating electrode. This volatilizes the silver coating at the site of the arc. The cooperating electrode is moved about to shift the arcing site for the removal of additional coating. Automatic capacitance adjustment may also be effected by arranging for the pointed electrode to automatically scan over the coating to be removed and connecting to the electrodes a control circuit which measures the capacitance and automatically terminates the arcing when the capacitance reaches the desired value.

Where desired, the inner capacitive electrodes 93 and 94 may be omitted, the conductive ends 84 and 86 being then suitably shaped to provide the desired capacitance in cooperation with the outer electrodes 91, 92.

Rivet 40 may be hollow to provide a socket for receiving a lead pin of the signal output plug 99.

Figure 5:
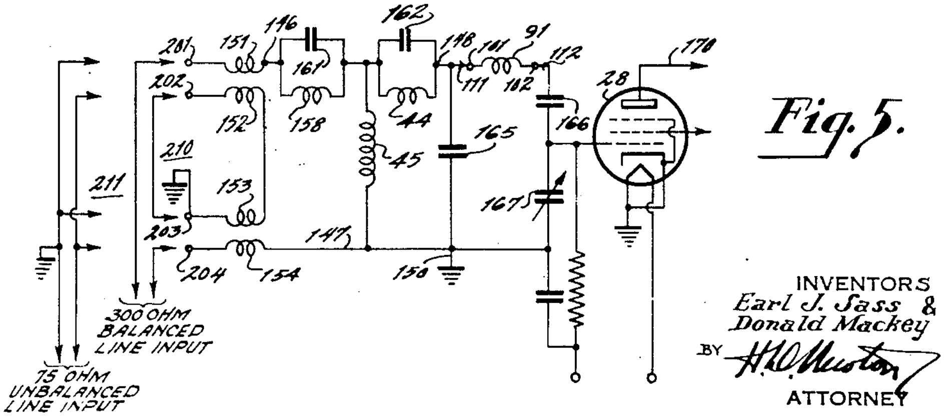
Figure 5 is a circuit diagram showing one type of electrical circuit arrangement for the structure of Figure 1.

The structure of Figures 1, 2, 3 and 4 makes a highly effective and inexpensive signal input circuit for television receivers, especially when used in the circuit arrangement of Figure 5.

Figure 5 shows terminals 201, 202, 203, 204 provide input signal supply connections to a so-called "elevator" input transformer consisting of four inductances 151, 152, 153, 154 having output leads 146, 147. Inductances 151 and 152 may be in the form of closely coupled bifilar windings spaced from the other inductances 153, 154 which may also be closely coupled bifilar windings. By providing such inductance pairs each equivalent to a transmission line of 150 ohm impedance, a standard 300 ohm balanced line, such as is conventionally used for antenna leads, may be connected to supply signals to terminals 201 and 204, terminals 202 and 203 being joined. Such a connection is schematically represented by the assembly 210. Unbalanced 300-ohm output connections may then be directly matched to output leads 146, 147 of the transformer, that is, one of these output leads may be grounded as shown.

However, by uniting terminal 201 with terminal 203, and uniting terminal 202 with terminal 204, a pair of input connections are made available for directly receiving signals from a standard 75 ohm coaxial or unbalanced transmission line, and also delivering 300 ohm unbalanced signals at output leads 146, 147. This connection is schematically represented by the assembly 211. Furthermore, if the input terminals are not grounded, a balanced 75 ohm line can be connected in place of the unbalanced 75 ohm line, and the transformer then also provides impedance matching to a 300 ohm unbalanced output. In addition to the above, an unbalanced 300 ohm input line may be connected to terminals 201, 204, in place of the balanced input assembly 210 and thereby also deliver an unbalanced 300 ohm output to leads 146, 147. The transformer input is accordingly suitable for use with any of the conventional standard signal supply lines.

As shown, lead 147 is grounded and a fixed high-pass filter, including inductances 158, 44, 45 and capacitances 161 and 162, is connected in the elevator transformer output circuit. This filter combination, part of which may be included within the casing 25, is arranged to have a low frequency cut-off which permits passage of signals having the lowest desired frequency. For improving the selection, the high pass filter may be arranged to provide a particularly high attenuation for undesired signals of a specific frequency below the nominal cut-off limit, for example intermediate frequency signals radiated from other similar receivers or signal transmitters, as by parallel tuning inductances 158 and 44 to this frequency with their respective capacitances 161, 162. This makes a highly effective arrangement for suppressing interference by undesired signals.

The output leads from the high-pass filter are 147 and 148, and a selectable low-pass filter, including inductance 91 and capacitances 165, 166, 167, connects these leads 147, 148, to the input electrodes of amplifier or mixer tube 28. Stray wiring capacitance and the input capacitance inherent in tube 28 are taken into account in the filters. Inductance 91 is selectably switched for the different signal channels, as indicated by the contacts 101, 111 and 102, 112. The individual inductances 91 are of such characteristics as to tune the circuit to pass the desired signals but block passage of those at higher frequency. Tube 28 may be connected in a more-or-less conventional amplification circuit, its amplified output being developed between output lead 170 and the common return conductor 150, and led to a further amplification, heterodyne or detector stage.

Although there are crossover connections inherent in this input circuit its subdivision into two interconnected circuit portions each free of circuit connections, simplifies its construction.

The input circuit construction may be varied in many respects, if desired. The individual inductors and capacitors can be arranged, for example, in different relations so that the capacitors are grouped in two rows of two each, rather than a single row of four, as shown above or in other patterns such as arcs of circles. Individual elements may be transferred from the circuit section on one face to that on the other.

A feature of the invention is the simplicity with which the capacitances are provided. By arranging the components so that a plurality of capacitances are located in closely spaced relation, a single dielectric sheet is enabled to provide a group of capacitors. This single sheet is readily connected in place without requiring any separate unusual attention to the individual connectors. Soldered connections may be provided between the conductive ends 75, 79, 77, 72 and the contacting rivet flanges 45 as by applying a soldering mixture to these ends before fastening the sheet 12 in place, and heating the mixture afterwards to fuse the solder and cause it to adhere to the cooperating surfaces. The application of both the solder mix and the heat may be effected with automatic machinery.

Another feature of the invention is the spacing apart of the circuit sections from each other. This greatly reduces the stray capacitances between the sections not only by reason of their greater separation but also because the intervening space is essentially air and has a lower dielectric constant than the carrier sheets. If the carrier sheets were placed in back-to-back contact with each other for example, the dielectric between the circuit portions would be substantially entirely the material of the sheet which may have dielectric constants about 4 times as high as air, thereby providing correspondingly higher intercircuit capacitances.

Additionally, the spaced relation of the carrier sheets makes it unnecessary to accurately position the individual circuit sections on their carrier sheets. This avoids any alignment problems that would be raised if the circuit sections were placed on opposite faces of the same carrier. Furthermore, the circuit elements including the capacitor dielectric can be protected from external mechanical damage by being located on the inner faces of the carriers, as shown in Figure 1. This also enables effective shielding of the entire circuit with the externally applied conductive strata 56 for example.

As alternative constructions in accordance with the invention, one or both of the external shields 56 may be omitted, and if desired, the corresponding carrier sheet may also have its circuit section placed on its external surface.

The invention may also be incorporated in other types of high frequency circuits as for example in fixed tune signal transfer circuits such as the standard intermediate frequency amplification channels of television or radio receivers.

What is claimed is:

1. In a high frequency electric circuit assembly, a first circuit section and a second circuit section, each section comprising a carrier plate of insulating material having electrically conductive coating portions on one surface thereof only providing an electrical circuit and an electrically conductive shield stratum on the other surface thereof for providing electric shielding of said electrical circuit, and means including spacer elements intermediately located at a plurality of positions upon said plates, said means holding said plates in spaced face-to-face relationship with said electrically conductive coating portions disposed therebetween in spaced relationship whereby the intercircuit capacitance of said assembly is minimized, at least some of said spacer elements being electrically conductive and connected to circuit sections upon each plate for interconnecting the sections at predetermined points precluding crossover connections upon said plates.

2. The combination as defined by claim 1, in which each of the circuit sections includes an inductance unit in the conductive coating portions thereof.

3. The combination as defined by claim 1, in which one of the circuit sections includes electrically coating portions and dielectric means forming a capacitor structure, the capacitor electrodes being held against opposite faces of said dielectric means and connected to predetermined parts of the circuit assembly to provide desired capacitance means therefor.

EARL J. SASS.
DONALD MACKEY.

REFERENCES CITED

The following references are of record in the file of this patent:

UNITED STATES PATENTS

| Number | Name | Date |
|---|---|---|
| 1,892,146 | Harshberger | Dec. 27, 1932 |
| 2,066,511 | Arlt | Jan. 5, 1937 |
| 2,221,105 | Otto | Nov. 12, 1940 |
| 2,441,960 | Eisler | May 25, 1948 |
| 2,474,988 | Sargrove | July 5, 1949 |
| 2,492,236 | Mydlil | Dec. 27, 1949 |
| 2,493,199 | Khouri et al. | Jan. 3, 1950 |
| 2,502,291 | Taylor | Mar. 28, 1950 |

FOREIGN PATENTS

| Number | Country | Date |
|---|---|---|
| 398,035 | Great Britain | Sept. 7, 1933 |